(12) United States Patent
Maeda

(10) Patent No.: US 6,388,892 B1
(45) Date of Patent: May 14, 2002

(54) TUNER UNIT

(75) Inventor: Osamu Maeda, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 0 days.

(21) Appl. No.: 09/542,594

(22) Filed: Apr. 4, 2000

(30) Foreign Application Priority Data

Apr. 8, 1999 (JP) ............................................. 11-002272

(51) Int. Cl.[7] .............................. H05K 1/14; H05K 7/10
(52) U.S. Cl. ....................... 361/801; 361/728; 361/740; 361/753; 361/759; 334/85; 330/65
(58) Field of Search ................................. 361/728, 740, 361/752, 753, 759, 801, 802, 809, 810, 732, 803; 174/35 R, 51; 334/85; 330/68

(56) References Cited

U.S. PATENT DOCUMENTS

| | | | | |
|---|---|---|---|---|
| 4,325,103 A | * | 4/1982 | Ito et al. ..................... | 361/816 |
| 4,948,923 A | * | 8/1990 | Suzuki ....................... | 174/35 R |
| 5,159,537 A | * | 10/1992 | Okano ......................... | 361/816 |
| 5,907,478 A | * | 5/1999 | Watanabe .................... | 361/807 |

FOREIGN PATENT DOCUMENTS

| | | | |
|---|---|---|---|
| JP | 63-185271 | | 11/1988 |
| JP | 6-17269 | | 3/1994 |
| JP | 6-120685 A | * | 4/1994 |
| JP | 8-195557 | | 7/1996 |

* cited by examiner

*Primary Examiner*—Jayprakash N. Gandhi
(74) *Attorney, Agent, or Firm*—Lackenbach Siegel, LLP

(57) ABSTRACT

A tuner unit includes a unit board. The unit board is formed, at its lower end, with a protrusion to have a terminal pattern formed on the protrusion. A frame chassis has a side plate having, at its lower end, a protrusion having a tapered side face in one of side faces. When the protrusion of the unit board is inserted in a hole of a main board, the tapered side face is inserted while abutted against an inner edge of a hole of the main board. This urges the protrusion in a direction that the terminal pattern is brought close to the connection pattern of the main board.

10 Claims, 4 Drawing Sheets

TUNER UNIT

BACKGROUND OF THE INVENTION

1. Field of the Invention

This invention relates generally to tuner units and, more particularly, to a tuner unit including a frame chassis formed by a metal plate and a unit board held by the frame chassis.

2. Description of the Prior Art

There is an example of a tuner unit of this kind as disclosed in a publication of Japanese Utility Model Laid-open No. S63-77400[H05K 9/00, 1/14, 7/14] laid open on May 23, 1988.

This prior art has a metal pin terminal provided in a lower end of its unit board. The metal pin terminal is inserted in a hole of a main board so that the metal pin terminal can be connected by soldering to a circuit pattern on the main board, thereby assembling a tuner unit onto the main board.

However, the prior art tuner unit requires to prepare a metal pin terminal and then insert the metal pin terminal to the unit board in advance of mounting the tuner unit onto the main board. Thus, the prior art has involved a problem of requiring excessive labor and time and hence cost.

SUMMARY OF THE INVENTION

Therefore, it is a primary object of the present invention to provide a novel tuner unit.

Another object of the invention is to provide a tuner unit that is low in price.

A tuner unit according to the present invention is a tuner unit having a frame chassis and a unit board to be mounted on the frame chassis and having on a surface thereof a first circuit pattern to be electrically connected to a second circuit pattern formed on a surface of a main board, comprising: a first protrusion formed at a lower end of the unit board and to be inserted in a first hole of the main board; a terminal pattern formed on the first protrusion and extended from the first circuit pattern; and urging means formed on the frame chassis to urge toward the second circuit pattern a surface having the terminal pattern of the first protrusion inserted in the first hole.

When mounting the tuner unit onto the main board, if the first protrusion of the unit board is inserted in the first hole, the urging means provided on the frame chassis causes the terminal pattern to be urged toward the second pattern of the main board. Thus, the terminal pattern and the second circuit pattern are brought close to each other. Accordingly, by merely soldering the main board with the tuner unit mounted on the main board, the terminal pattern can be connected directly to the second circuit pattern.

Incidentally, where the frame chassis includes a metal plate and a second protrusion formed in a lower end of the metal plate and to be inserted in a second hole of the main board, the urging means is formed on the second protrusion. More specifically, the urging means includes a tapered side face formed on the second protrusion so that the tapered side face and an inner peripheral edge of the second hole can cooperate to urge the first protrusion of the unit board when inserting the second protrusion in the second hole.

The tapered side face has a corresponding distance of a slant to an amount of displacement by which the first protrusion is to be urged.

According to the present invention, the first circuit pattern of the unit board and the second circuit pattern of the main board can be electrically connected by merely inserting and soldering the unit board directly to the main board. Thus, there is no need of separately preparing a metal pin terminal as required in the conventional, resulting in considerable cost reduction.

The above described objects and other objects, features, aspects and advantages of the present invention will become more apparent from the following detailed description of the present invention when taken in conjunction with the accompanying drawings.

DETAILED DESCRIPTION OF THE PREFERRED EMBODIMENT

Figure 1:
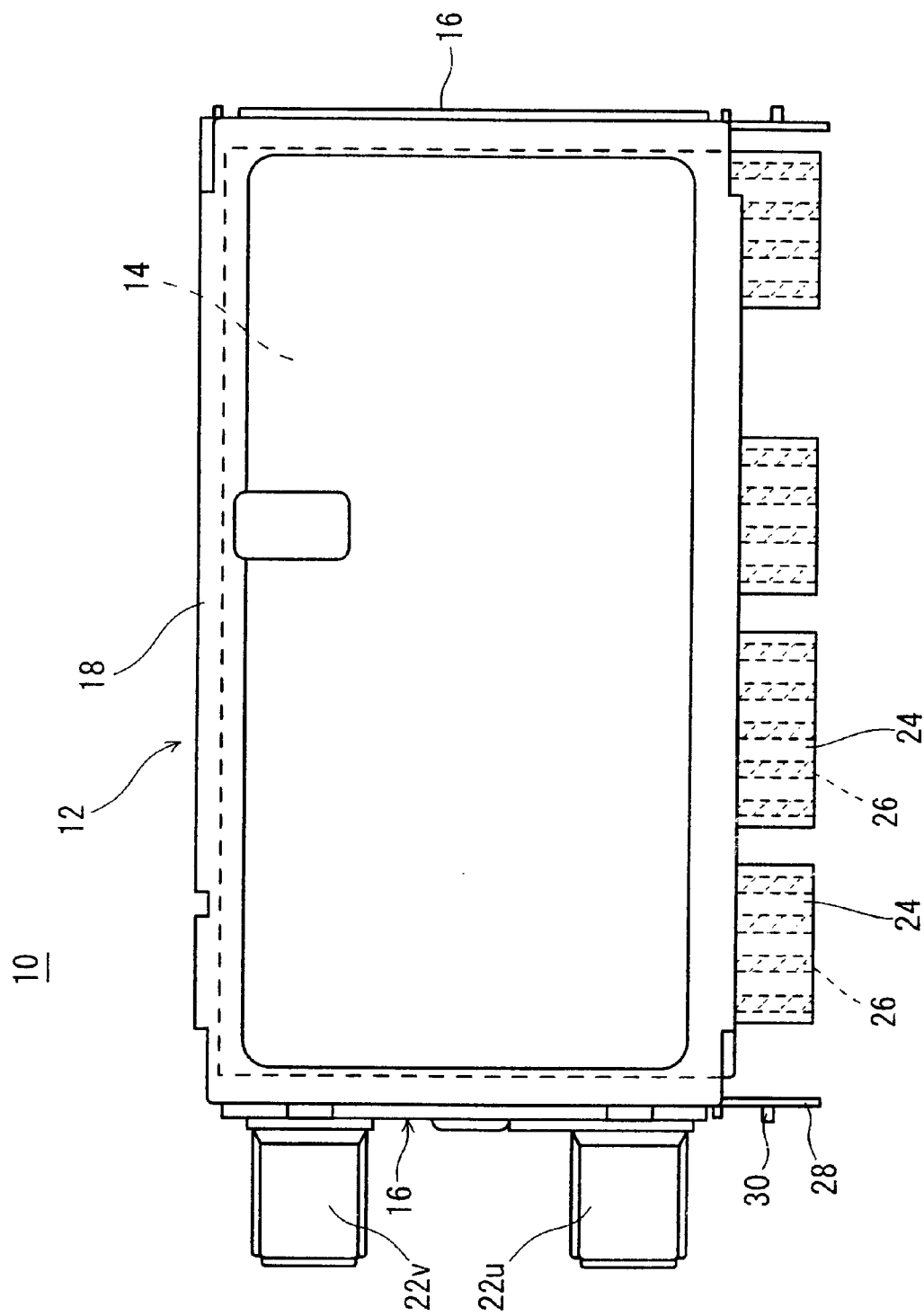
FIG. 1 is an illustrative view of a tuner unit according to one embodiment of the present invention, as viewed from the front.
Figure 2:
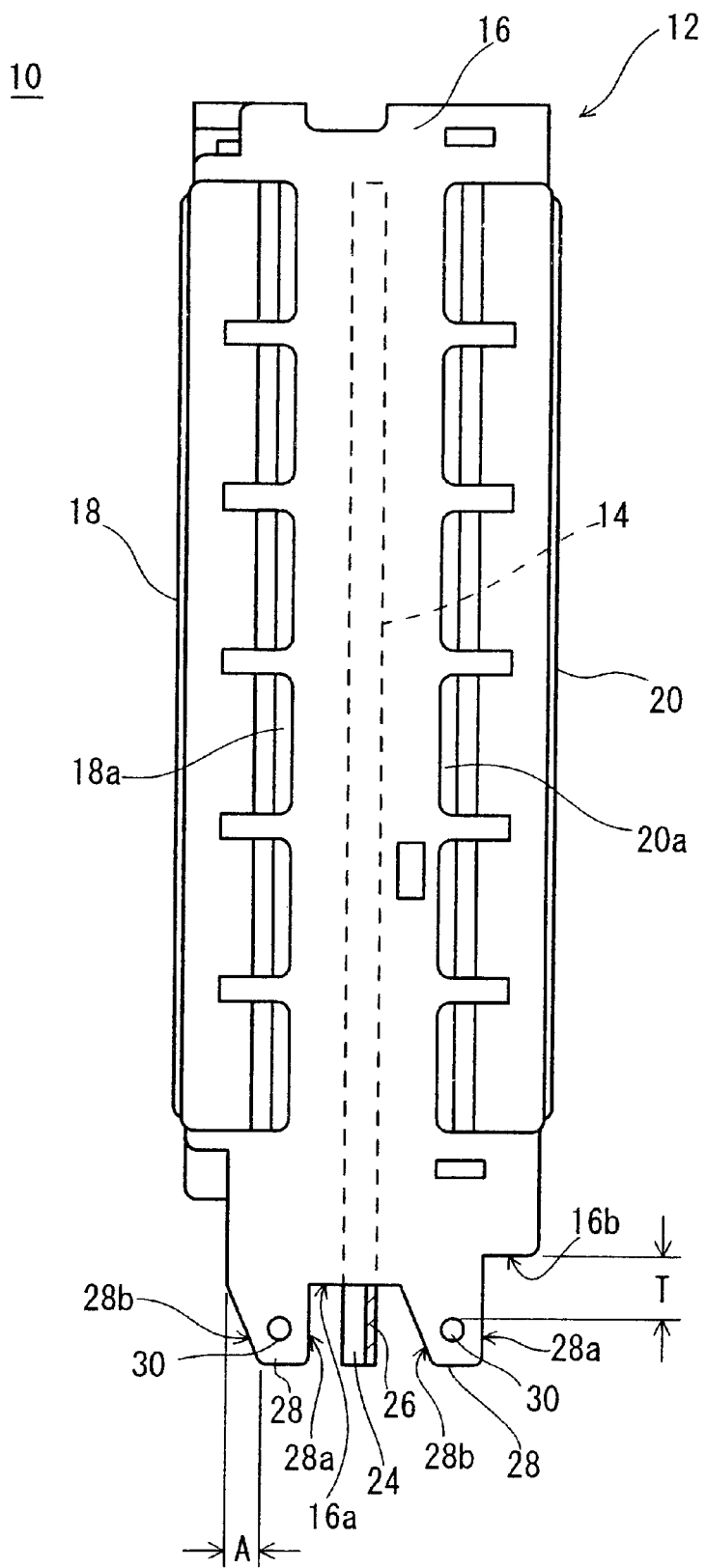
FIG. 2 is an illustrative view of the tuner unit of the FIG. 1 embodiment, as viewed from the side.

Referring to FIG. 1 and FIG. 2, a tuner unit 10 of this embodiment includes a frame chassis 12. This frame chassis 12 supports a unit board 14. Note that in FIG. 1 and FIG. 2 the unit board 14 is partly expressed by dotted lines depicting the that the most part of unit board 14 is accommodated in the frame chassis 12.

The frame chassis 12 includes two side plates 16 and 16, a front plate 18 and rear plate 20 to be fitted on the outer surfaces of side plates 16 and 16 through spring pieces 18a and 20a. These side plates 16, front plate 18 and rear plate 20 are metal plates. Accordingly, the frame chassis 12 serves to provide the unit board 14 with electrical shield, in addition to holding the unit board 14.

The two side plates 16 of the frame chassis 12 are almost same in shape and arranged in a direction that their main surfaces are directed perpendicular to a main surface of the unit board 14. As will be well seen in FIG. 1, antenna connection plugs 22v and 22u are provided on one side plate 16. These antenna connection plugs 22v and 22u are connected to predetermined connection points of a tuner circuit (not shown) provided on the unit board 14 in the frame chassis 12.

The unit board 14 has one main surface as a mount surface to mount thereon components for forming the tuner circuit. The other surface is a pattern surface having a tuner circuit pattern (first circuit patterns). A plurality of protrusions 24 are formed at a lower end of the unit board 14 in a manner extending downward. These protrusions 24 are spaced one another with respect to a direction of a surface of the unit board 14. The protrusions 24 serve as a first protrusion and have, on a pattern surface, terminal patterns 26 extended from the tuner circuit pattern. More specifically, the terminal patters 26 in a predetermined number are formed at a predetermined interval on each protrusion 24 with respect to the surface of the unit board 14. The terminal patterns 26 are individually and directly connected by soldering to a connection pattern on the main board 32 shown in FIG. 3, as will be explained hereafter.

Incidentally, in this embodiment first protrusions 24 were formed at the lower end of the unit board 14 and the terminal patterns 26 in a predetermined number were arranged on each protrusion 24. Alternatively, one protrusion may be solely formed to have all the required terminal patterns formed on the protrusion.

Figure 3:
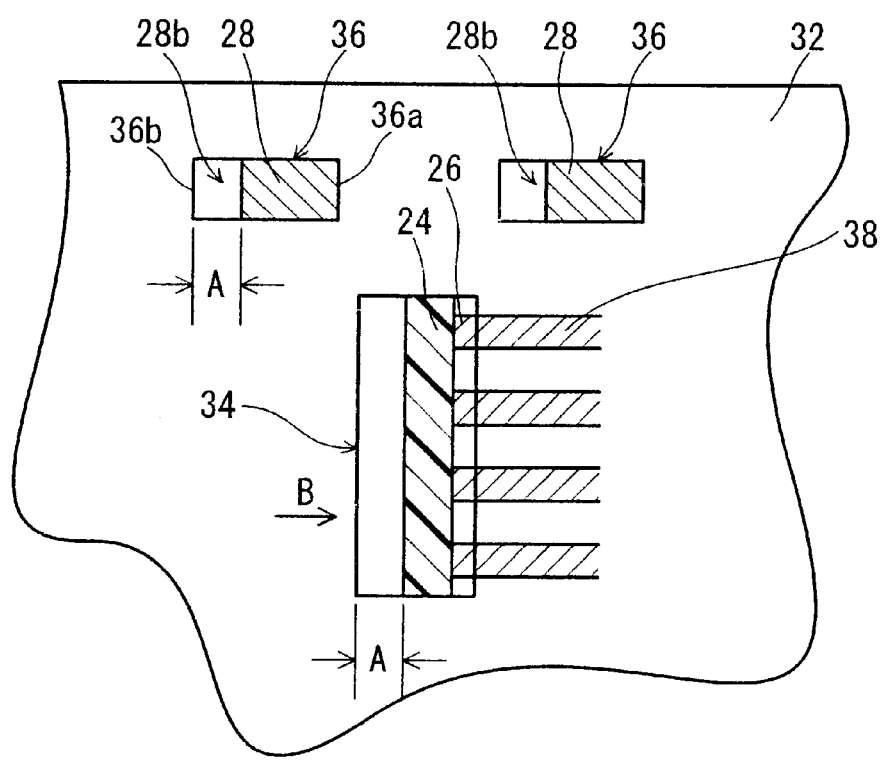
FIG. 3 is an illustrative view of the embodiment tuner unit mounted on a main board, as viewed from the back.

The side plate 16a has two protrusions (second protrusions) 28 formed extending downward from a lower end 16a thereof and spaced from each other with respect to a surface direction of the side plate 16. The protrusion 28 includes a side face 28a vertical to the lower end 16a and a tapered side face 28b slanted at a certain angle with respect to the lower end 16a. Meanwhile, projections 30 are formed on respective outer surfaces of the protrusions 28. The projections 30 serve as removal preventing projections to prevent the tuner unit 10 from being removed from the main board 32 when the tuner unit 10 is attached to the main board 32 (FIG. 3). Accordingly, in the side plate 16 a distance T given between a point 16b (FIG. 2) to be abutted against the main board and a top end of the projection 30 is greater than a thickness of the main board 32, e.g. 0.8 mm or 1.6 mm or greater. Preferably, the distance T may be a dimension required for the tuner unit 10 to stand by itself on the main board 10, in addition to the thickness of main board.

Incidentally, although the tapered side face 28b is slanted within a range of distance A, the distance A is set at such a distance as required to urge the unit board 14 or protrusion 24, as will be explained hereafter.

As shown in FIG. 3, the main board 32 has rectangular holes (first holes) 34. The rectangular holes 34 are formed in positions corresponding to the protrusions 24 in order to receive the protrusions 24 of the unit board 14. In FIG. 3, only one of the rectangular hole 34 is shown. The main board 32 also has two rectangular holes 36. The rectangular holes 36 are formed in the vicinity of the rectangular hole 34 and arranged in a direction perpendicular to the rectangular hole 34. The two rectangular holes 36 serve as second holes to receive the protrusions 28 of the side plate 16 of the frame chassis 12. The reason of forming the rectangular hole 34 and the rectangular holes 36 in a perpendicular relation is because that the unit board 14 and the side plate 16 are to be arranged perpendicular at their main surfaces to each other. Alternatively, these rectangular holes 34 and 36 may be in an elliptic form.

Furthermore, the main board 32 has a required circuit pattern, not shown, formed on a back surface thereof. This circuit pattern has a connection pattern (second circuit pattern) 38 formed extending therefrom and having a tip at an inner edge of the above-mentioned rectangular hole 34. Note that this circuit pattern or connection pattern 38 is not necessarily extended at its tip up to an inner edge of the rectangular hole 34. It may be formed terminating at such an arbitrary point that the connection pattern or terminal pattern 26 is allowed to be directly soldered to the connection pattern 38.

Figure 4:
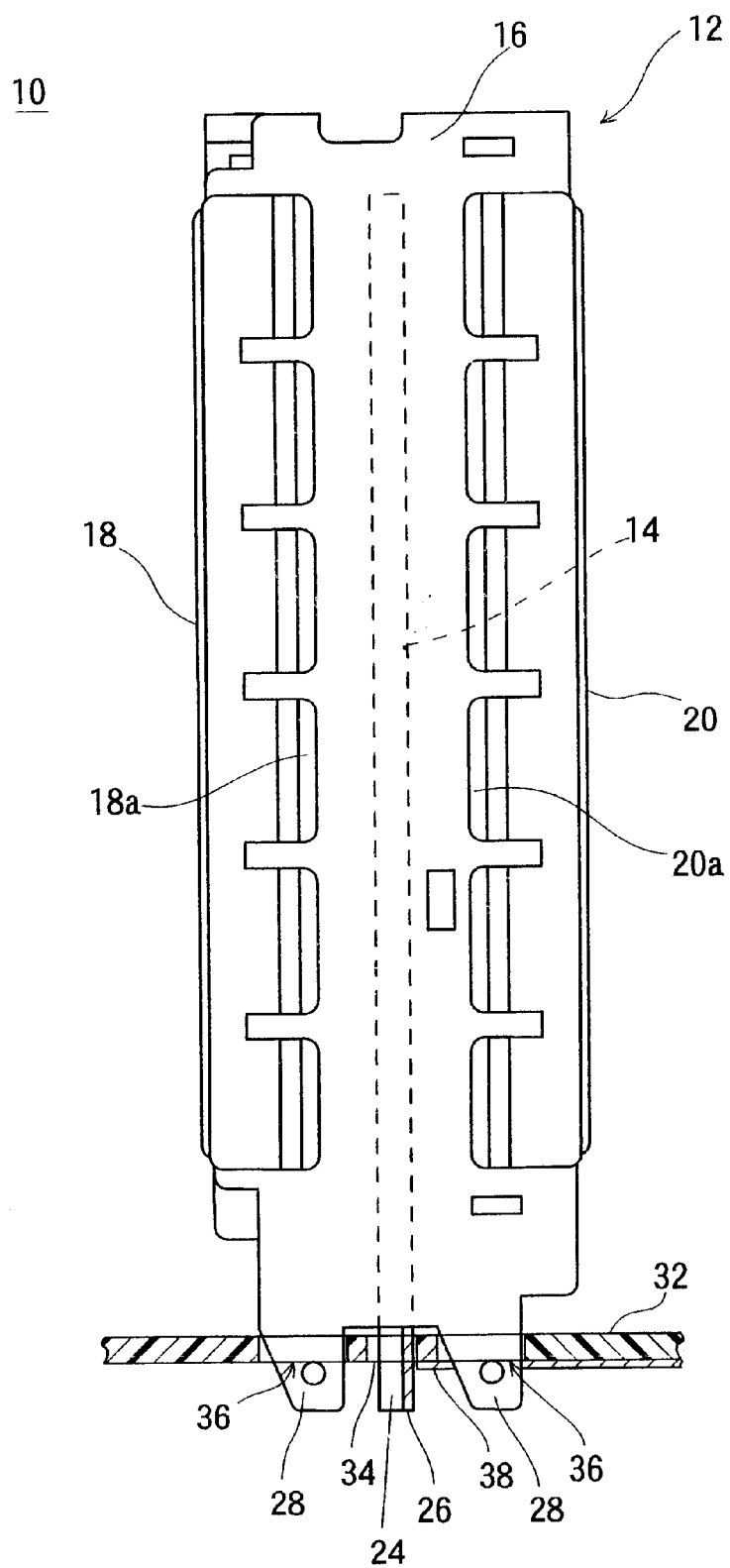
FIG. 4 is an illustrative view of the tuner unit and the board as one unit.

Referring now more particularly to FIG. 4 which illustrates the situation or the case of mounting the tuner unit pen on to the main board 32, the first protrusions 24 formed at the lower end of the unit board 14 are respectively inserted into the first holes 34 and further the second protrusions 28 of the side plates 16 of the frame chassis 12 are inserted in the second holes 36. When the protrusion 28 is inserted in the rectangular hole 36, one side face 28a (FIG. 2) is inserted without abutment against one short side 36a of the rectangular hole 36. However, the tapered side face 28b (FIG. 2) is inserted while abutted against the other short side.

As will be understood from FIG. 2, the tapered side face 28b is slanted such that the protrusion 28 increases in width in a direction of from its lower end toward the upper. Consequently, as the protrusion 28 is inserted in the rectangular hole 36, the tapered sides face 28b abuts against the other short side 36b of the rectangular hole 36. Due to this, the unit board or protrusion 24 is urged in a direction of the arrow B. That is, the tapered side 28b cooperates with the rectangular hole 36 inner edge or short side to urge the protrusion 24 in a direction the terminal pattern 26 approaches the connection pattern 38. The distance A that the protrusion is urged is determined by a distance A (FIG. 2) given by the tapered side face 28b, as mentioned before.

In this manner, when mounting the tuner unit 10 on the main board 32, the protrusions 24 are urged by a distance A in a predetermined direction due to the effect of the protrusions 28 of the side plate 16. As a result, the terminal pattern 26 is brought closer to the connection pattern 28. Therefore, by merely soldering the main board 32 as it is, the terminal pattern 26 can be solder-connected directly to the connection pattern 38. This makes it unnecessary to use a metal pin terminal as required in the conventional. Thus, largely reducing the cost is to be expected.

Incidentally, in the above embodiment two protrusions 28 were formed in the side plate 16. However, the protrusion 28 where possible may be one in number.

Furthermore, in the above embodiment the urging means was constituted by the tapered side face 28b on the side plate 16 protrusion 28. Alternatively, an arbitrary part of the frame chassis 12 may be utilized or a proper means be added to the frame chassis 12 in order to urge the unit board 14 or protrusion 24.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A tuner unit having a frame chassis and a unit board to be mounted on said frame chassis and having on a surface thereof a first circuit pattern to be electrically connected to a second circuit pattern formed on a surface of a main board, comprising:

a first protrusion formed at a lower end of said unit board and to be inserted into a first hole of said main board;

a terminal pattern formed on said first protrusion and extended from said first circuit pattern; and urging means formed on said frame chassis to urge toward said second circuit pattern in a direction parallel with the surface of the main board a surface having said terminal pattern of said first protrusion inserted in said first hole.

2. A tuner unit according to claim 1, wherein said frame chassis includes a metal plate and a second protrusion formed in the lower end of said metal plate and to be inserted into a second hole of said main board, and said urging means being formed on said second protrusion.

3. A tuner unit according to claim 2, wherein said urging means includes a tapered side face formed on said second protrusion, and said tapered side face and an inner peripheral edge of said second hole cooperating to urge said first protrusion of said unit board when inserting said second protrusion in said second hole.

4. A tuner unit according to claim 3, wherein said tapered side face has a corresponding distance of a slant to an amount of displacement by which said first protrusion is to be urged.

5. A tuner unit according to claim 2, wherein said second protrusion further includes a removal preventive projection, which, when inserted in said second hole, engages a backside of said main board.

6. A tuner unit according to claim 3, wherein said second protrusion further includes a removal preventive projection, which, when inserted in said second hole, engages a back side of said main board.

7. A tuner unit according to claim 4, wherein said second protrusion further includes a removal preventive projection, which, when inserted in said second hole, engages a back side of said main board.

8. A tuner unit according to claim 2, wherein said second protrusion has a pair of dissimilar opposite surfaces.

9. A tuner unit according to claim 3, wherein said second protrusion includes another side face vertical to its lower end.

10. A tuner according to claim 2, wherein said second protrusion includes a first side face vertical to its lower end and a second side face tapered toward its lower end.

* * * * *